United States Patent
Kyoto

(10) Patent No.: US 10,998,692 B2
(45) Date of Patent: May 4, 2021

(54) LASER OSCILLATION DEVICE

(71) Applicant: Mitsubishi Electric Corporation, Tokyo (JP)

(72) Inventor: Tomohiro Kyoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/957,108

(22) PCT Filed: Feb. 22, 2018

(86) PCT No.: PCT/JP2018/006579
§ 371 (c)(1),
(2) Date: Jun. 23, 2020

(87) PCT Pub. No.: WO2019/163069
PCT Pub. Date: Aug. 29, 2019

(65) Prior Publication Data
US 2020/0395733 A1    Dec. 17, 2020

(51) Int. Cl.
*H01S 3/131*    (2006.01)
*H01S 3/134*    (2006.01)
(Continued)

(52) U.S. Cl.
CPC .......... *H01S 3/131* (2013.01); *H01S 3/08086* (2013.01); *H01S 3/134* (2013.01);
(Continued)

(58) Field of Classification Search
CPC ...... H01S 3/131; H01S 3/2391; H01S 3/1312; H01S 3/08086; H01S 3/134;
(Continued)

(56) References Cited

U.S. PATENT DOCUMENTS

2002/0000426 A1    1/2002    Mead et al.
2002/0024664 A1    2/2002    Yokota et al.
(Continued)

FOREIGN PATENT DOCUMENTS

JP    S61-219489 A    9/1986
JP    61-292982 A    12/1986
(Continued)

OTHER PUBLICATIONS

International Search Report and Written Opinion dated Apr. 3, 2018 for PCT/JP2018/006579 filed on Feb. 22, 2018, 8 pages including English Translation of the International Search Report.
(Continued)

*Primary Examiner* — M. A. Golub-Miller
(74) *Attorney, Agent, or Firm* — Xsensus LLP

(57) ABSTRACT

A laser oscillation device includes a laser oscillation unit, which is a laser oscillation part that generates multiple first laser beams having different wavelengths from one another, multiple sensors having different sensitivity characteristics from one another each representing light-receiving sensitivity for the wavelengths of the multiple first laser beams, to each output first voltages dependent on outputs of the multiple first laser beams. The laser oscillation device includes a computing unit that corrects the multiple first voltages using the sensitivity characteristics of the multiple sensors, and controls the laser oscillation unit based on multiple second voltages which correspond to multiple first voltages obtained after the correction.

7 Claims, 10 Drawing Sheets

(51) Int. Cl.
*H01S 5/0683* (2006.01)
*H01S 5/0687* (2006.01)
*H01S 3/08* (2006.01)
*H01S 3/23* (2006.01)
*H01S 3/10* (2006.01)
*H01S 3/13* (2006.01)
*B23K 26/06* (2014.01)
*B23K 26/70* (2014.01)

(52) U.S. Cl.
CPC .......... *H01S 3/1312* (2013.01); *H01S 3/2391* (2013.01); *H01S 5/0683* (2013.01); *H01S 5/0687* (2013.01); *B23K 26/0626* (2013.01); *B23K 26/705* (2015.10); *H01S 3/10069* (2013.01); *H01S 3/1305* (2013.01)

(58) Field of Classification Search
CPC .. H01S 5/0683; H01S 5/0687; H01S 3/10069; H01S 3/1305; B23K 26/06; B23K 26/702
See application file for complete search history.

(56) References Cited

U.S. PATENT DOCUMENTS

| | | | |
|---|---|---|---|
| 2002/0186729 | A1 | 12/2002 | Nasu et al. |
| 2004/0013352 | A1 | 1/2004 | Khayim et al. |
| 2006/0176917 | A1* | 8/2006 | Grek ................ H01S 3/134 372/29.02 |
| 2008/0084605 | A1 | 4/2008 | Rothenberg et al. |
| 2013/0215916 | A1 | 8/2013 | Kakizaki et al. |
| 2016/0036194 | A1* | 2/2016 | Sato ................ H01S 3/094053 359/345 |
| 2016/0067995 | A1 | 3/2016 | Richter |
| 2016/0276799 | A1 | 9/2016 | Shoda et al. |
| 2017/0304942 | A1 | 10/2017 | Ogata |
| 2019/0176264 | A1* | 6/2019 | Kyoto ................ H01S 5/40 |
| 2020/0388980 | A1* | 12/2020 | Kyoto ................ B23K 26/0608 |

FOREIGN PATENT DOCUMENTS

| | | | |
|---|---|---|---|
| JP | 62-226684 | A | 10/1987 |
| JP | 9-135047 | A | 5/1997 |
| JP | 2000-029143 | A | 1/2000 |
| JP | 2002-062189 | A | 2/2002 |
| JP | 2003-060293 | A | 2/2003 |
| JP | 2003-332678 | A | 11/2003 |
| JP | 2008-145133 | A | 6/2008 |
| JP | 2008-151546 | A | 7/2008 |
| JP | 2010-212549 | A | 9/2010 |
| JP | 2013-062484 | A | 4/2013 |
| JP | 2015-233105 | A | 12/2015 |
| JP | 2016-078050 | A | 5/2016 |
| JP | 2016-528056 | A | 9/2016 |
| JP | 2016-206085 | A | 12/2016 |
| WO | 2015/083200 | A1 | 6/2015 |
| WO | 2016/060095 | A1 | 4/2016 |

OTHER PUBLICATIONS

Notification of Reasons for Refusal received for Japanese Patent Application No. 2018-530910, dated Aug. 14, 2018, 10 pages including English Translation.

Decision to Grant a Patent received for Japanese Patent Application No. 2018-530910, dated Dec. 11, 2018, 5 pages including English Translation.

* cited by examiner

LASER OSCILLATION DEVICE

CROSS-REFERENCE TO RELATED APPLICATION

The present application is based on PCT filing PCT/JP2018/006579, filed Feb. 22, 2018, the entire contents of which are incorporated herein by reference.

FIELD

The present invention relates to a laser oscillation device that combines two or more laser beams having their respective wavelengths different from each other into a single laser beam and outputs the single laser beam.

BACKGROUND

In recent years, attention has been given to a technique for an industrial laser machine tool, in which laser beams emitted from two or more semiconductor lasers that output laser beams having their respective wavelengths different from one another are combined together, thereby to provide a higher output. A laser device disclosed in Patent Literature 1 includes: a spectrum detector that is a laser output detection unit detecting outputs of two or more laser beams having their respective wavelengths different from one another, and outputting voltage values corresponding to the detected outputs of the laser beams; a multi-wavelength oscillation control mechanism that controls energies at wavelength peaks of the two or more laser beams; and a control unit that controls the said multi-wavelength oscillation control mechanism on the basis of the detection results obtained by the spectrum detector. The laser device disclosed in Patent Literature 1 controls the outputs of the laser beams based on the detection results of the single spectrum detector.

CITATION LIST

Patent Literature

Patent Literature 1: Japanese Patent Application Laid-open No. 2013-062484

SUMMARY

Technical Problem

As in the spectrum detector described above, an output detection unit that detects an output of a laser beam has a sensitivity varying depending on wavelength. For this reason, even when the output detection unit receives laser beams having their equal intensities, the output detection unit may output different voltage values depending on the wavelength. The laser device of Patent Literature 1 is configured such that, for example, a decrease in the output of a laser beam having a first wavelength, of the two or more wavelengths, causes the outputs of the laser beams having two or more wavelengths to be controlled in a uniform manner based on the voltage value outputted from the output detection unit that has received the laser beam having the first wavelength. Therefore, there has been a problem in that the output value of a single laser beam obtained by combining two or more laser beams having their respective wavelengths different from one another cannot be adjusted to match a target value.

The present invention has been made in view of the foregoing circumstances, and it is an object of the present invention to provide a laser oscillation device that can improve an accuracy of output control of a single laser beam resulting from combining two or more laser beams having their respective wavelengths different from one another.

Solution to Problem

In order to solve the above-mentioned problem and achieve the object, the present invention provides a laser oscillation device comprising: a laser oscillation unit to generate a plurality of first laser beams having their respective wavelengths different from one another; a plurality of sensors having their respective sensitivity characteristics different from one another, the sensitivity characteristics each representing light-receiving sensitivity for the wavelengths of the first laser beams, the sensors outputting first voltages dependent on outputs of first laser beams; and a computing unit to correct the first voltages using the sensitivity characteristics of the sensors, and control the laser oscillation unit based on a plurality of second voltages that are the corrected first voltages.

Advantageous Effects of Invention

A laser oscillation device according to the present invention exerts an advantageous effect in that it can improve an accuracy of output control of a single laser beam obtained by combining two or more laser sub-beams having their respective wavelengths different from one another.

DESCRIPTION OF EMBODIMENT

A laser oscillation device according to an embodiment of the present invention will be described in detail below with reference to the drawings. Note that the embodiment is not intended to limit the scope of this invention.

Embodiment

Figure 1:
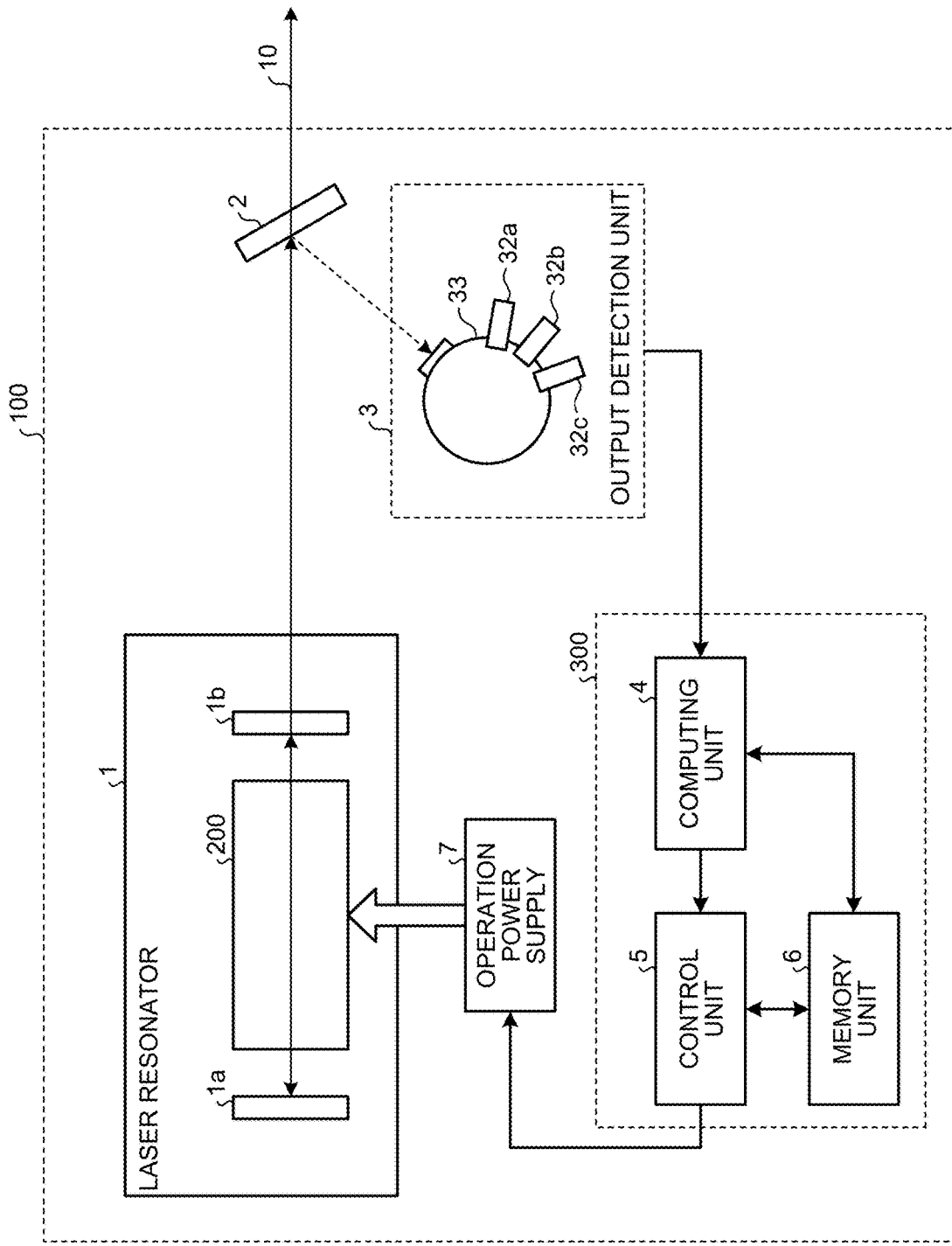
FIG. 1 is a configuration diagram of a laser oscillation device according to an embodiment of the present invention.

FIG. 1 is a configuration diagram of a laser oscillation device according to an embodiment of the present invention. A laser oscillation device 100 according to the embodiment includes: a laser resonator 1 which is a laser oscillation unit that combines multiple laser beams having their respective wavelengths different from one another into a single laser beam 10 and outputs the single laser beam 10; a first partial reflection mirror 2 which reflects a part of the laser beam 10 outputted from the laser resonator 1; an output detection unit 3 which detects the laser beam reflected by the first partial reflection mirror 2; a computing unit 4; a control unit 5; a memory unit 6; and an operation power supply 7. The computing unit 4, the control unit 5, and the memory unit 6 constitute a laser output control unit 300.

The laser resonator 1 includes a total reflection mirror 1a, a second partial reflection mirror 1b, and an excitation unit 200. By way of example, in a case of a semiconductor laser, an active layer of the excitation unit 200 is supplied with electrical power from the operation power supply 7. In a case of a YAG laser, electrical power is supplied from the operation power supply 7 to a lamp, thus causing light to be emitted from the lamp to a YAG rod of the excitation unit 200, or electrical power is supplied from the operation power supply 7 to a laser diode, thus causing laser light to be emitted from the laser diode to the YAG rod of the excitation unit 200. In a case of a gas laser, a laser gas in the excitation unit 200 is supplied with electrical power from the operation power supply 7 to perform electric discharge. In this way, supply of electrical power from the operation power supply 7 to the excitation unit 200 causes the light outputted from the excitation unit 200 to resonate between the total reflection mirror 1a and the second partial reflection mirror 1b, and thus part of the resonant light is outputted from the laser resonator 1 as the laser beam 10. The laser beam 10 is a light beam resulting from combination of laser beams having their respective wavelengths different from one another, such as, for example, a wavelength $\lambda_1$, a wavelength $\lambda_2$, a wavelength $\lambda_3$, and a wavelength $\lambda_4$. Note that the number of wavelengths contained in the laser beam 10 only needs to be more than one, and is not necessarily limited to four.

The wavelength $\lambda_1$ may be hereinafter referred to simply as $\lambda_1$. Similarly, the wavelength $\lambda_2$, the wavelength $\lambda_3$, and the wavelength $\lambda_4$ may be hereinafter referred to simply as $\lambda_2$, $\lambda_3$, and $\lambda_4$, respectively. The laser beam 10 outputted from the laser resonator 1 mostly passes through the first partial reflection mirror 2, and the remaining part thereof is incident on the output detection unit 3. The wavelength $\lambda_2$ is greater than $\lambda_1$, $\lambda_3$ is greater than $\lambda_2$, and $\lambda_4$ is greater than $\lambda_3$.

The output detection unit 3 configured to detect a laser beam detects an output of the laser beam incident from the first partial reflection mirror 2, and outputs a voltage value corresponding to the output of the laser beam detected. The output detection unit 3 includes an integrating sphere 33 on which a laser beam is incident from the first partial reflection mirror 2, and multiple sensors 32a, 32b, and 32c disposed on the integrating sphere 33.

The multiple sensors 32a, 32b, and 32c have their respective sensitivity characteristics different from one another, each of the characteristics representing light-receiving sensitivity over the wavelengths of the laser beam incident on the integrating sphere 33. The multiple sensors 32a, 32b, and 32c each output a voltage value, which represents a first voltage for each wavelength, depending on the intensity of the laser beam incident on the integrating sphere 33 and on the corresponding sensitivity characteristic. That is, the multiple sensors 32a, 32b, and 32c have their respective sensitivity characteristics different from one another, each of the characteristics representing light-receiving sensitivity over a wavelength of each of the multiple first laser beams, and each output a first voltage according to the outputs of the multiple first laser beams. Each of the multiple sensors 32a, 32b, and 32c may be hereinafter referred to as "each sensor". A voltage value for each wavelength outputted from each of the multiple sensors 32a, 32b, and 32c may also be referred to as sensor output.

Figure 2:
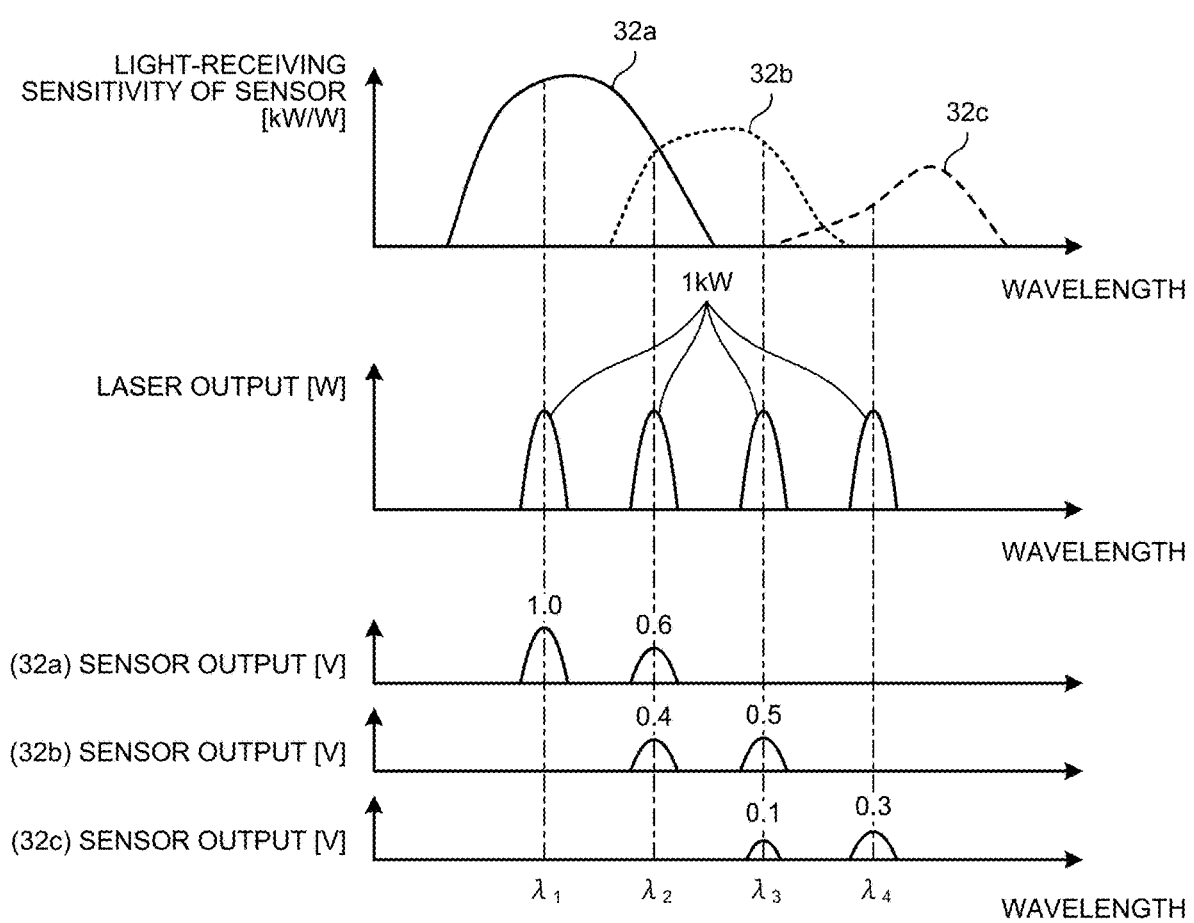
FIG. 2 is a chart for describing a sensitivity characteristic and a sensor output of each of the two or more sensors illustrated in FIG. 1.

FIG. 2 is a chart for describing a sensitivity characteristic and a sensor output of each of the multiple sensors illustrated in FIG. 1. FIG. 2 illustrates, from top to bottom thereof, sensitivity characteristics of the multiple sensors, spectra of the multiple laser beams having their respective wavelengths different from one another, an output level of the sensor 32a, an output level of the sensor 32b, and an output level of the sensor 32c.

The topmost portion of FIG. 2 illustrates the light-receiving sensitivity of the sensor 32a over the wavelengths of the incident laser beam, the light-receiving sensitivity of the sensor 32b over the wavelengths of the incident laser beam, and the light-receiving sensitivity of the sensor 32c over the wavelengths of the incident laser beam. As illustrated in FIG. 2, the light-receiving sensitivities of the sensors 32a, 32b, and 32c have their respective values different depending on wavelength. As illustrated in the topmost portion of FIG. 2, the sensor 32a has a sensitivity characteristic that is such a sensitivity characteristic that higher sensitivities are exhibited at $\lambda_1$ and $\lambda_2$; the sensor 32b has a sensitivity characteristic that is such a sensitivity characteristic that higher sensitivities are exhibited at $\lambda_2$ and $\lambda_3$; and the sensor 32c has a sensitivity characteristic that is such a sensitivity characteristic that higher sensitivities are exhibited at $\lambda_3$ and $\lambda_4$.

The second top portion of FIG. 2 illustrates an example of the laser beam incident on the integrating sphere 33 as laser outputs. In the example illustrated in FIG. 2, the power of the laser output is 1 kW at each of $\lambda_1$, $\lambda_2$, $\lambda_3$, and $\lambda_4$.

The third portion from the top of FIG. 2 illustrates the sensor output when the laser beam illustrated in the second top portion of FIG. 2 is incident on the sensor 32a having the light-receiving sensitivity illustrated in the topmost portion of FIG. 2. As illustrated in the third portion from the top of FIG. 2, the value corresponding to $\lambda_1$ of the sensor outputs outputted from the sensor 32a is 1.0 V, and the value corresponding to $\lambda_2$ of the sensor outputs outputted from the sensor 32a is 0.6 V. In the example illustrated in FIG. 2, the sum of the voltage values of the wavelengths of the sensor outputs outputted from the sensor 32a is thus 1.6 V.

The fourth portion from the top of FIG. 2 illustrates the sensor output when the laser beam illustrated in the second top portion of FIG. 2 is incident on the sensor 32b having the light-receiving sensitivity illustrated in the topmost portion of FIG. 2. As illustrated in the fourth portion from the top of FIG. 2, the value corresponding to $\lambda_2$ of the sensor outputs outputted from the sensor 32b is 0.4 V, and the value corresponding to $\lambda_3$ of the sensor outputs outputted from the sensor 32b is 0.5 V. In the example illustrated in FIG. 2, the sum of the voltage values of the wavelengths of the sensor outputs outputted from the sensor 32b is thus 0.9 V.

The fifth portion from the top of FIG. 2 illustrates the sensor output when the laser beam illustrated in the second top portion of FIG. 2 is incident on the sensor 32c having the light-receiving sensitivity illustrated in the topmost portion of FIG. 2. As illustrated in the fifth portion from the top of FIG. 2, the value corresponding to $\lambda_3$ of the sensor outputs outputted from the sensor 32c is 0.1 V, and the value corresponding to $\lambda_4$ of the sensor outputs outputted from the sensor 32c is 0.3 V. In the example illustrated in FIG. 2, the sum of the voltage values of the wavelengths of the sensor outputs outputted from the sensor 32c is thus 0.4 V.

As described above, the output detection unit 3 illustrated in FIG. 1 uses the three sensors 32a, 32b, and 32c having different sensitivity characteristics, and the sensor outputs of the three sensors 32a, 32b, and 32c have different values.

The laser oscillation device 100 according to the embodiment includes a computing unit 4 that is configured to correct the sensor output of each of the three sensors 32a, 32b, and 32c having their respective sensitivity characteristics illustrated in FIG. 2, and control the laser output of each wavelength using the sensor outputs obtained by the correction, in order to adjust the output of the laser beam 10 outputted from the laser resonator 1 to match a target output value. The computing unit 4 is a computing means for correcting two or more first voltages using the sensitivity characteristics of the multiple sensors, and controlling the laser oscillation unit based on two or more second voltages that correspond to the two or more first voltages obtained after the correction. In addition, the computing unit 4 controls the laser oscillation unit so that the output value of a second laser beam resulting from combining of the multiple first laser beams matches a target value, using the total value of the multiple second voltages. An operation of the laser oscillation device 100 illustrated in FIG. 1 will next be described with reference to FIG. 3.

Figure 3:
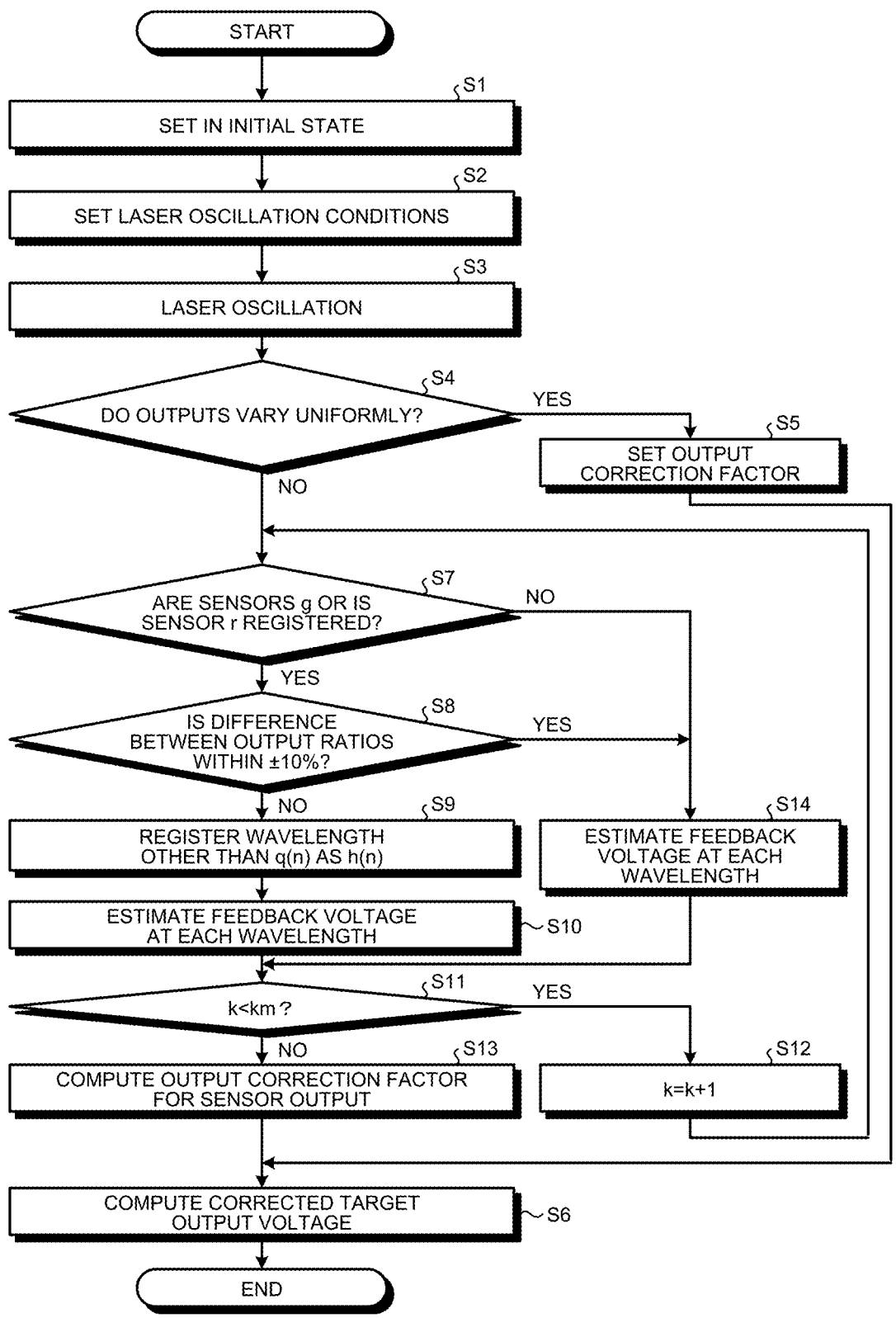
FIG. 3 is a flowchart for describing an operation of the laser oscillation device illustrated in FIG. 1.

FIG. 3 is a flowchart for describing an operation of the laser oscillation device illustrated in FIG. 1.

At step S1, the laser oscillation device 100 is set in an initial state. Examples of the settings include the following. Information on these settings is stored in the memory unit 6. Note that, in the description of information on the settings below, the subscript "$a$" represents all the wavelengths. The subscript "$_0$" represents an initial state. "k" (k=1, 2, ..., km) represents a sensor number. For example, a number of the sensor 32a is "1", a number of the sensor 32b is "2", and a number of the sensor 32c is "3". km represents the number of sensors. "n" represents a wavelength number.

(1) Total value $W_{a0}$ [W] of the outputs of the multiple laser beams of $\lambda_1$ to $\lambda_4$ (2) Total value $V_{a0}(k)$ [V] of the sensor outputs of the sensors (3) Value $W_0(n)$ [W] of each of outputs of the multiple laser beams of $\lambda_1$ to $\lambda_4$ (4) Sensor output $V_0(k, n)$ [V] of each sensor, which corresponds to each of outputs of the multiple laser beams of $\lambda_1$ to $\lambda_4$ (5) Sensor sensitivity $\alpha(k, n)$ [kW/V] of each sensor for each of the multiple laser beams of $\lambda_1$ to $\lambda_4$ (6) Output rate $\beta_0(k, n)$ for each or the wavelengths of the sensors (7) Laser wavelength set f(k, n) detected by each sensor (8) Set of sensors g(k, n) that detect one and the same wavelength The laser wavelength set f of the above item (7) has, for example, $\lambda_1$ and $\lambda_2$ as wavelengths of the laser beams detected by the sensor 32a, $\lambda_2$ and $\lambda_3$ as wavelengths of the laser beams detected by the sensor 32b, and $\lambda_3$ and $\lambda_4$ as wavelengths of the laser beams detected by the sensor 32c. The set of sensors g of the above item (8) is, for example, a set of the sensor 32a and the sensor 32b that both detect the laser output of $\lambda_2$. Another example of the set of sensors g of the above item (8) is a set of the sensor 32b and the sensor 32c that both detect the laser output of $\lambda_3$.

At step S2, laser oscillation conditions are set that are to be inputted based on a machining requirement and/or the like during operation of the laser oscillation device 100. Examples of the laser oscillation conditions include the following. Information on these laser oscillation conditions is stored in the memory unit 6.

(9) Laser output $W_a$ [W]

(10) Target output voltage $V_a(k)$ [V] of each sensor ($V_a = V_{a0} \times W_a \div W_{a0}$)

(11) Target output voltage V(k, n) [V] for each wavelength of sensors ($V = V_a \times \beta_0$)

At step S3, laser oscillation is performed according to the conditions that have been set at step S2. Upon the laser oscillation, the computing unit 4 computes, according to the following expression (1), an output ratio $\gamma(k)$ [%] between the target output voltage $V_a$ of each sensor and a total value $V_{a\text{-}buck}(k)$ [V] of feedback, which is the value of a sensor output of each sensor.

$$\gamma = V_{a\text{-}buck} \div V_a(k) \tag{1}$$

Upon the laser oscillation, the computing unit 4 further computes an average value $\gamma_{ave}$ [%] of an output ratio $\gamma$ of each sensor, a maximum value $\gamma_{max}$ [%] of a sensor output of each of the sensors, and a minimum value $\gamma_{min}$ [%] of a sensor output of each of the sensors.

Upon laser oscillation, the computing unit 4 still further computes an output ratio dispersion $\sigma$ [%] among the sensors according to the following expression (2).

$$\sigma = (\gamma_{max} - \gamma_{min}) \div \gamma_{ave} \tag{2}$$

After the calculation of the output ratio $\gamma$, the computing unit 4 registers a wavelength covered by a sensor whose output ratio $\gamma$ is 100±2% or less, as q(n) in the memory unit 6. The computing unit 4 further registers a sensor that detects only the wavelength of q(n) as r(k) in the memory unit 6.

At step S4, the computing unit 4 determines whether or not the outputs of the laser beams of $\lambda_1$ to $\lambda_4$ vary uniformly. By way of example, if the output ratio dispersions $\sigma$ of the sensors all fall within ±5% inclusive (Yes at S4), each of the outputs of the laser beams of $\lambda_1$ to $\lambda_4$ varies uniformly, and so the computing unit 4 recognizes changes in the laser outputs do not have a difference depending on wavelength and performs the process of step S5.

Otherwise, if the output ratio dispersions $\sigma$ and the output ratio dispersion $\sigma_c$ exceed ±5% (No at S4), the computing unit 4 determines that the output of at least one laser beam of the laser beams of $\lambda_1$ to $\lambda_4$ varies, and that the laser outputs vary differently depending on wavelength, and thus the computing unit 4 performs the process of step S7.

At step S5, the computing unit 4 computes an output correction factor $\eta_{ave}$ according to the following expression (3).

$$\eta_{ave} = 1 \div \gamma_{ave} \tag{3}$$

At step S6, the computing unit 4 computes a corrected target output voltage $V_a(k)'$ [V] of each sensor according to the following expression (4).

$$V_a(k)' = V_a(k) \times \eta_{ave} \tag{4}$$

At step S7, the computing unit 4 sets k=1, and then determines whether a set of sensors g or a sensor r(k) that detects only the wavelength of q(n) is registered in the memory unit 6.

If a set of sensors g or a sensor r(k) that detects only the wavelength of q(n) is registered in the memory unit 6 (Yes at S7), the computing unit 4 performs the process of step S8.

If a set of sensors g or a sensor r(k) that detects only the wavelength of q(n) is not registered in the memory unit 6 (No at S7), the computing unit 4 performs the process of step S14.

At step S8, the computing unit 4 compares the output ratios γ [%] of the registered multiple sensors g, and determines whether or not the difference therebetween falls within ±10% inclusive.

If the difference between the output ratios γ of the multiple sensors g falls within ±10% inclusive (Yes at S8), the computing unit 4 performs the process of step S14. More specifically, when the output ratio γ for $\lambda_1$ is 95% and the output ratio γ for $\lambda_2$ is 100.0%, only the output ratio γ for $\lambda_1$ has decreased. However, for the reason that the amount of change in output of the entire laser beam 10 is significantly small, the computing unit 4 recognizes that an output of each of the laser beams of $\lambda_1$ to $\lambda_4$ varies uniformly, and thus performs the process of step S14.

Otherwise, if a difference between the output ratios γ of the multiple sensors g exceeds ±10% (No at S8), the computing unit 4 performs the process of step S9.

At step S9, the computing unit 4 registers the wavelength(s) other than the wavelength q(n) registered in the memory unit 6, in the memory unit 6, as a wavelength h(n) at which the laser output has varied.

Specifically, assuming that the output ratio γ for $\lambda_1$ is 87.5%, and the output ratio γ for $\lambda_2$ is 100.0%, the output ratio γ for $\lambda_2$ detected by both the sensor 32a and the sensor 32b is not decreased, but only the output ratio γ for $\lambda_1$ detected by only the sensor 32a decreases. Accordingly, the computing unit 4 estimates that there is no reduction in the sensor output due to aging of the sensor 32a, but the laser output of $\lambda_1$ is decreased. The computing unit 4 then registers $\lambda_1$ of the laser output estimated as such, as the wavelength h(n), in the memory unit 6. After the registration of the wavelength h(n), the computing unit 4 performs the process of step S10.

At step S10, the computing unit 4 estimates a feedback voltage at each wavelength with respect to the feedback value of each sensor. Specifically, at step S10, the computing unit 4 computes a feedback value $V_{buck1}(k, n)$ [V] for the wavelength q(n) other than the wavelength h(n) according to the following expression (5).

$$V_{buck1}=V(k,n) \quad (5)$$

In addition, at step S10, if the number of wavelengths h(n) is one for each sensor, the computing unit 4 computes a feedback value $V_{buck2}(k, n)$ [V] for the wavelength h(n) according to the following expression (6).

$$V_{buck2}=V_a-V_{buck1}(k,n) \quad (6)$$

Alternatively, at step S10, if the number of wavelengths h(n) is more than one for each sensor, the computing unit 4 computes an output $V_{buck3}(k, n)$ [V] for each wavelength of each sensor according to the following expression (7). $V_{a-buck1}(k, n)$ represents a feedback value that is the sum of the sensor outputs corresponding to the wavelengths exhibiting change, of the sensor outputs of the sensors. $\beta_h(k, n)$ represents an output rate for each wavelength exhibiting a change in each sensor.

$$V_{buck3}=V_{a-buck1} \times \beta_h(k,n) \quad (7)$$

At step S11, if "k" is less than "km" (Yes at S11), the computing unit 4 adds 1 to "k" at step S12, and then repeats the processes of from step S7 to step S11. If "k" is equal to "km" (No at S11), the computing unit 4 performs the process of step S13.

At step S13, the computing unit 4 computes an output correction factor $\eta_{ave}$ for a sensor output for each wavelength according to the following expression (8).

$$\eta_{ave}=W_a \div W_{a-buck} \quad (8)$$

The estimated total output $W_{a-buck}$ [kW] in the above expression (8) is an estimated output of the laser beam 10, and is computed according to $W_{a-buck}=\Sigma(W_{buck-ave}(m))$, where m is an integer equal to 1 or greater, and $W_{buck-ave}$ is the average value of estimated sensor outputs $W_{buck}(k, n)$ [kW] of the wavelengths. $W_{buck}$ is computed according to $W_{buck}=V_{buck} \times \alpha$, where $V_{buck}(k, n)$ [V] is a value obtained by estimating the output voltage at each wavelength with respect to the feedback value from the corresponding sensor.

After the process of step S13, the computing unit 4 computes, at step S6, the corrected target output voltage $V_a(k)'$ [V] of each sensor, using the output correction factor $\eta_{ave}$ for the sensor output computed at step S13.

At step S14, the computing unit 4 multiplies the feedback value $V_{a-buck}(k, n)$ of each sensor by an output rate $\beta_0(k, n)$ for each wavelength of each sensor as shown in the following expression (9), thus to estimate the feedback voltage $V_{buck}(k, n)$ [V] at each wavelength. After the estimation of the feedback voltage $V_{buck}(k, n)$ [V], the computing unit 4 performs the process of step S11.

$$V_{buck}=V_{a-buck} \times \beta_0 \quad (9)$$

The control unit 5 illustrated in FIG. 1 controls the operation power supply 7 to make the output value of the single combined laser beam 10 equal to a target value using the target output voltage $V_a(k)'$ [V] computed at step S6.

Because a sensor sensitivity of each of the sensors, i.e., sensor outputs obtained in response to receiving the laser outputs are different from each other depending on wavelength, the laser oscillation device 100 needs to take into consideration the sensor sensitivity of each sensor to wavelength of a laser beam, in order to more precisely control the output of the laser beam 10 using sensor outputs. Because each sensor outputs a sum of multiple sensor outputs corresponding to their respective wavelengths, it is not necessary to set a feedback value taking account of the sensor sensitivity in the laser oscillation device 100 in a case where the laser outputs of the wavelengths vary with uniformity. However, in a case where a laser output of a particular wavelength varies more greatly than the laser output(s) at different wavelength(s), it is necessary to set a feedback value in consideration of the sensor sensitivities in the laser oscillation device 100. Therefore, when a sensor output varies, the laser oscillation device 100 makes computation to determine whether the laser outputs of their respective wavelengths vary uniformly, or whether the laser output of a particular wavelength varies more greatly than the other laser output(s) at the other wavelength(s), based on the difference of each sensor output from a target value.

In addition, of the multiple sensors used in the laser oscillation device 100, any one or more sensors that receive as input thereof a laser output of one and the same wavelength. The laser oscillation device 100 identifies a difference between sensor outputs of the multiple sensors that receive a laser output of one and the same wavelength, identifies a wavelength of the laser output that has varied, based on the identified difference between the sensor outputs, and estimates that a laser output of a wavelength other than the identified wavelength has not varied. Moreover, in a case where the wavelength of the laser output that has varied is unidentifiable, the laser oscillation device 100 recognizes that the laser outputs of the wavelengths vary with uniformity.

Furthermore, the laser oscillation device 100 predicts an output voltage for each wavelength of the sensors, and then estimates the output of the laser beam 10, i.e., the total output, using the output voltages and output sensitivities. In addition, the laser oscillation device 100 computes an output correction factor $\eta_{ave}$ representing how the estimated total output differs from the laser output $W_a$ set as a laser oscillation condition, and then computes the target output voltage $V_a(k)'$ [V] of each sensor using the output correction factor $\eta_{ave}$.

Note that the laser oscillation device 100 of the embodiment is not limited to the example illustrated in FIG. 1, and may also be configured as follows.

Figure 4:
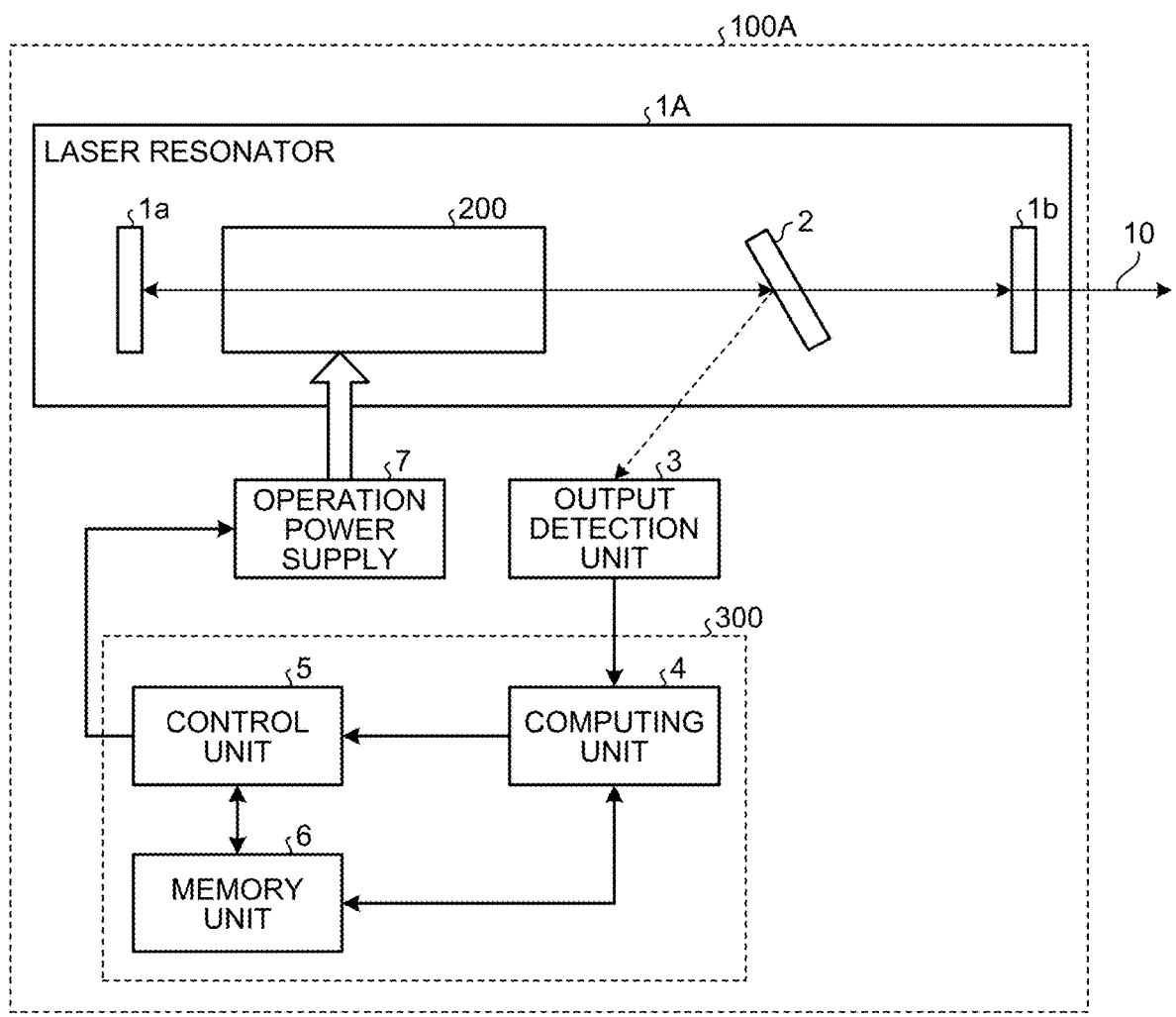
FIG. 4 is a configuration diagram of a laser oscillation device according to a first variation of the embodiment of the present invention.

FIG. 4 is a configuration diagram of a laser oscillation device according to a first variation of the embodiment of the present invention. A laser oscillation device 100A illustrated in FIG. 4 includes a laser resonator 1A in place of the laser resonator 1 illustrated in FIG. 1. In the laser resonator 1A, the first partial reflection mirror 2 is disposed between the total reflection mirror 1a and the second partial reflection mirror 1b.

Even such a configuration allows the output detection unit 3 to receive a part of the laser beam 10 reflected by the first partial reflection mirror 2, and thus the computing unit 4 can estimate the sensor output of each sensor included in the output detection unit 3 to compute the corrected target output voltage $V_a(k)'$ [V]. In addition, in the laser oscillation device 100A, because the first partial reflection mirror 2 is incorporated in the laser resonator 1A during production of the laser resonator 1A, adjustment of the attachment position of the first partial reflection mirror 2 and adjustment of an incident angle of the laser beam 10 to the first partial reflection mirror 2 are facilitated as compared to a case where the first partial reflection mirror 2 is disposed outside the laser resonator 1A.

Figure 5:
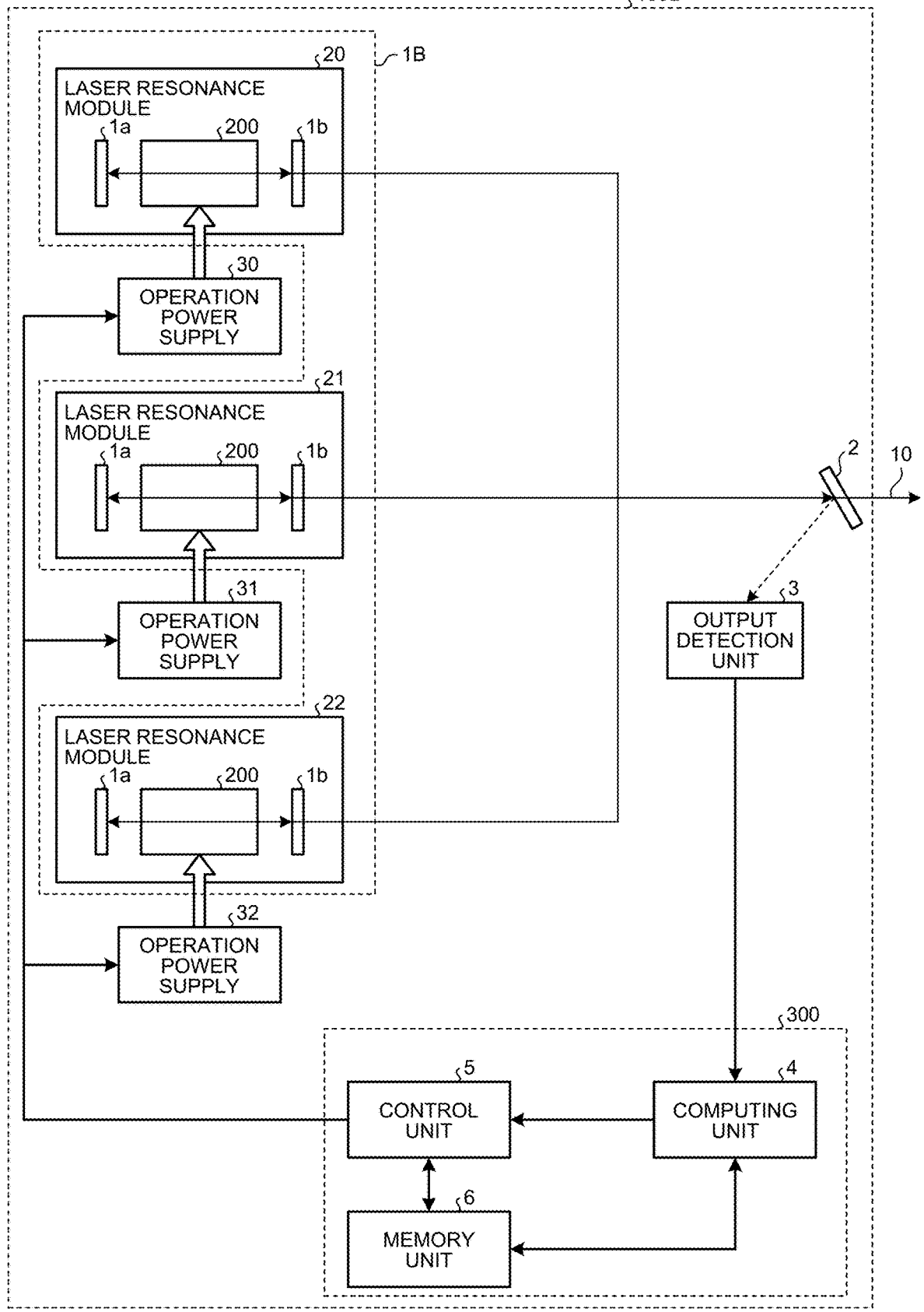
FIG. 5 is a configuration diagram of a laser oscillation device according to a second variation of the embodiment of the present invention.

FIG. 5 is a configuration diagram of a laser oscillation device according to a second variation of the embodiment of the present invention. A laser oscillation device 100B illustrated in FIG. 5 includes a laser resonator 1B and multiple operation power supplies 30, 31, and 32 in place of the laser resonator 1 and the operation power supply 7 illustrated in FIG. 1.

The laser resonator 1B includes multiple laser resonance modules 20, 21, and 22 that output laser beams having their respective wavelengths different from one another. The laser resonance module 20 is supplied with electric power from the operation power supply 30. The laser resonance module 21 is supplied with electric power from the operation power supply 31. The laser resonance module 22 is supplied with electrical power from the operation power supply 32.

The laser beams respectively outputted from the multiple laser resonance modules 20, 21, and 22 are combined together into the laser beam 10, which is then outputted. Even in the case of such a configuration, a part of the laser beam 10 reflected by the first partial reflection mirror 2 is received by the output detection unit 3, and so the computing unit 4 can estimate the sensor output of each sensor included in the output detection unit 3 to compute the corrected target output voltage $V_a(k)'$ [V]. In addition, since the multiple laser resonance modules 20, 21, and 22 are used in the laser oscillation device 100B, output adjustment for the laser beam 10 is facilitated as compared to the case of use of the laser resonator 1 illustrated in FIG. 1, by means of change in the number of laser resonance modules in the laser oscillation device 100B.

Figure 6:
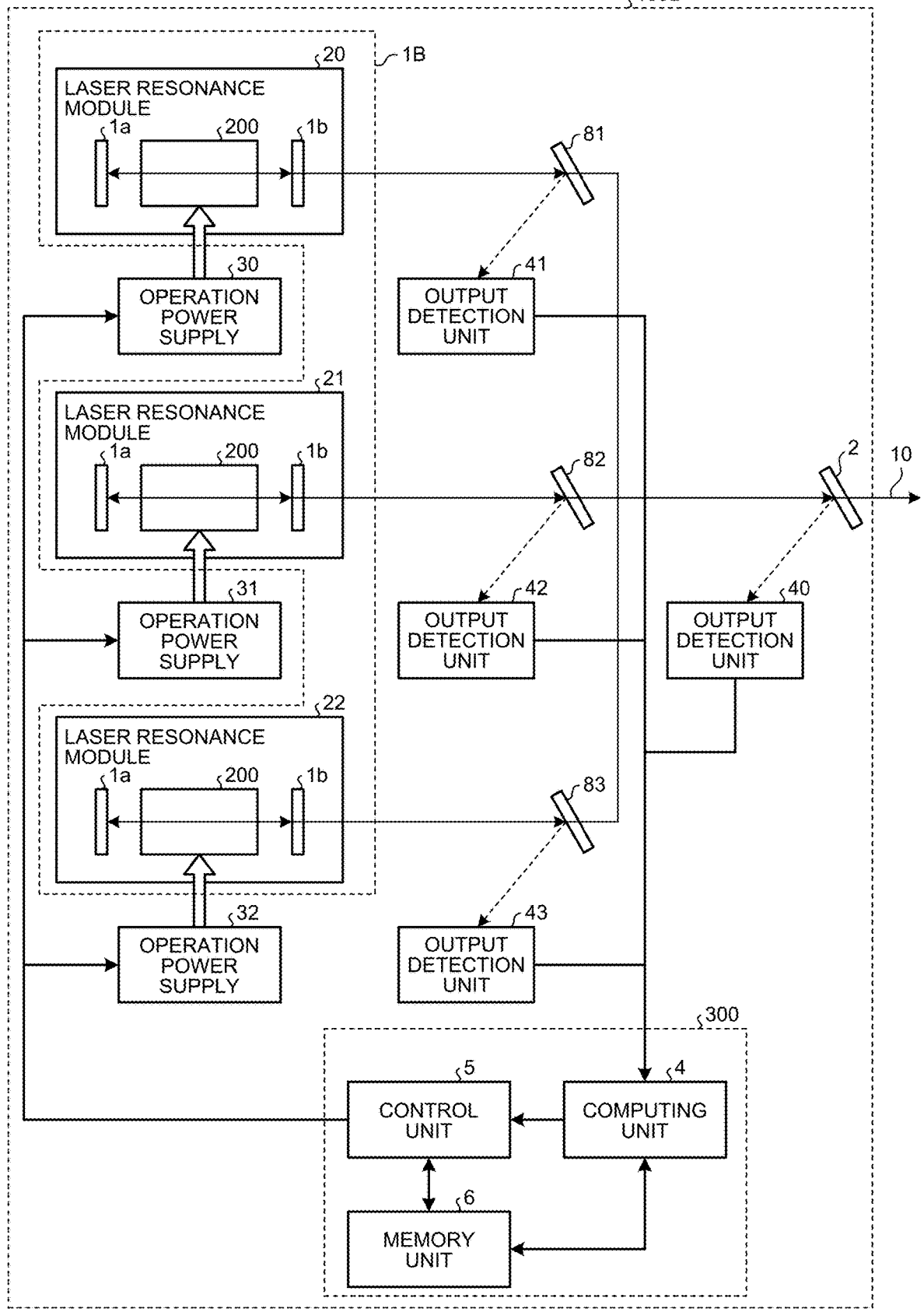
FIG. 6 is a configuration diagram of a laser oscillation device according to a third variation of the embodiment of the present invention.

FIG. 6 is a configuration diagram of a laser oscillation device according to a third variation of the embodiment of the present invention. A laser oscillation device 100D illustrated in FIG. 6 further includes multiple fourth partial reflection mirrors 81, 82, and 83 in addition to the first partial reflection mirror 2.

The fourth partial reflection mirror 81 reflects a part of the laser beam outputted from the laser resonance module 20, and transmits the remaining part of that laser beam therethrough. The fourth partial reflection mirror 82 reflects a part of the laser beam outputted from the laser resonance module 21, and transmits the remaining part of that laser beam therethrough. The fourth partial reflection mirror 83 reflects a part of the laser beam outputted from the laser resonance module 22, and transmits the remaining part of that laser beam therethrough. The laser beams having passed through the multiple fourth partial reflection mirrors 81, 82, and 83 are combined together into the laser beam 10, which is then inputted to the first partial reflection mirror 2. Note that the multiple laser resonance modules 20, 21, and 22 may each be hereinafter referred to as "each module". In addition, the laser beam 10 may be referred to as post-combination laser beam.

In addition, the laser oscillation device 100D includes multiple output detection units 40, 41, 42, and 43 in place of the output detection unit 3 illustrated in FIG. 5.

The output detection unit 40 is configured similarly to the output detection unit 3. The output detection unit 41 includes a sensor on which the laser beam reflected by the fourth partial reflection mirror 81 is incident. This sensor is, for example, a sensor corresponding to the sensor 32a illustrated in FIG. 1.

The output detection unit 42 includes a sensor on which the laser beam reflected by the fourth partial reflection mirror 82 is incident. This sensor is, for example, a sensor corresponding to the sensor 32b illustrated in FIG. 1.

The output detection unit 43 includes a sensor on which the laser beam reflected by the fourth partial reflection mirror 83 is incident. This sensor is, for example, a sensor corresponding to the sensor 32c illustrated in FIG. 1.

The output detection unit 40 includes multiple sensors on which the laser beam reflected by the first partial reflection mirror 2 is incident. These multiple sensors are, for example, the sensors 32a, 32b, and 32c illustrated in FIG. 1.

Figure 7:
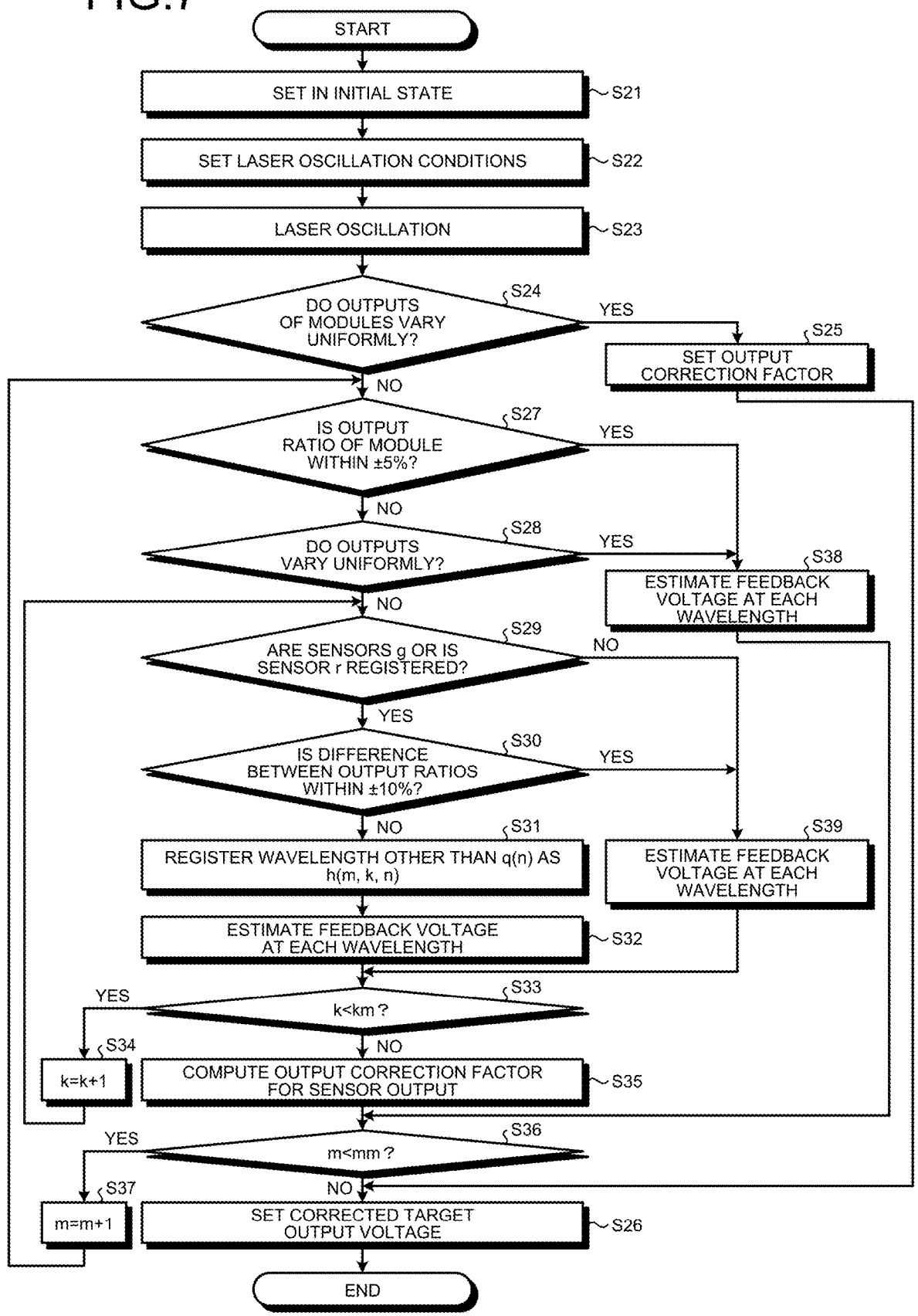
FIG. 7 is a flowchart for describing an operation of the laser oscillation device illustrated in FIG. 6.

FIG. 7 is a flowchart for describing an operation of the laser oscillation device illustrated in FIG. 6. At step S21, the laser oscillation device 100D is set in an initial state. Examples of the settings include the following. Information on these settings is stored in the memory unit 6. Note that, in the description of the settings below, the subscript "$_a$" represents "all". The subscript "$_0$" represents an "initial" state. The subscript "$_c$" indicates "post-combination". "k" (k=1, 2, . . . , km) represents a sensor number. For example, a number of the sensor 32a is 1, and a number of the sensor 32b is 2. km represents the number of sensors. "n" represents a wavelength number. "m" (m=1, 2, . . . , mm) represents a number of a laser resonance module. For example, a number of the laser resonance module 20 is 1, and a number of the laser resonance module 21 is 2. mm represents the number of laser resonance modules.

(1) Laser output $W_{a0}(m)$ [W] of each module
(2) Post-combination laser beam output value $W_{ca0}$ [W]

(3) Sensor output (sum over the wavelengths) $V_{a0}(m, k)$ [V] of the sensor disposed in each of the multiple output detection units 41, 42, and 43

(4) Total value $V_{ca0}(k)$ [V] of the sensor outputs (sum over the wavelengths) of the multiple sensors disposed in the output detection unit 40

(5) Laser output $W_0(m, n)$ [W] for each wavelength of each module (6) Each sensor output voltage $V_0(m, k, n)$ [V] corresponding to $W_0$ (7) Laser output $W_{co}(n)$ [W] for each wavelength of the post-combination laser beam output (8) Each sensor output voltage $V_{co}(k, n)$ [V] corresponding to $W_{co}$ (9) Sensor sensitivity $\alpha(m, k, n)$ [kW/V] of a sensor disposed in each of the multiple output detection units 41, 42, and 43, for each wavelength

(10) Sensor sensitivity $\alpha_c(k, n)$ [kW/V] of the multiple sensors disposed in the output detection unit 40 for each wavelength

(11) Output rate $\beta_0(m, k, n)$ of the sensor disposed in each of the multiple output detection units 41, 42, and 43, for each wavelength

(12) Output rate $\beta_{c0}(k, n)$ of the multiple sensors disposed in the output detection unit 40 for each wavelength

(13) Wavelength set $f(m, k, n)$ of a laser beam detected by each sensor

(14) Set of sensors $g(m, k, n)$ that detects one and the same wavelength

At step S22, laser oscillation conditions are set. Examples of the laser oscillation conditions include the following. Information on these laser oscillation conditions is stored in the memory unit 6.

(15) Laser output $W_{ca}$ [W]

(16) Target output voltage $V_a(m, k)$ [V] of the sensor disposed in each of the multiple output detection units 41, 42, and 43 ($V_a = V_{a0} \times W_{ca} \div W_{ca0}$)

(17) Target output voltage $V_{ca}(k)$ [V] of the multiple sensors disposed in the output detection unit 40 ($V_{ca} = V_{ca0} \times W_{ca} \div W_{ca0}$)

(18) Target output voltage $V(m, k, n)$ [V] of the sensor disposed in each of the multiple output detection units 41, 42, and 43 for each wavelength ($V = V_a \times \beta_0$)

(19) Target output voltage $V_c(k, n)$ [V] of the multiple sensors disposed in the output detection unit 40 for each wavelength ($V_c = V_{ca}(k) \times \beta_{c0}(k, n)$)

At step S23, laser oscillation is performed according to the conditions that have been set at step S22. Upon the laser oscillation, the computing unit 4 computes an output ratio $\gamma(m)$ [%] between the total value of target output voltages $V_a$ of the sensors disposed in each of the multiple output detection units 41, 42, and 43, and a feedback value $V_{a\text{-}buck}(m, k)$ [V], which is the value of the sensor output of the sensor disposed in each of the multiple output detection units 41, 42, and 43, according to the following expression (10).

$$\gamma = \Sigma V_{a\text{-}buck} \div \Sigma V_a \qquad (10)$$

Upon the laser oscillation, the computing unit 4 further computes an output ratio $\gamma_c(k)$ [%] between the post-combination output feedback value $V_{ca\text{-}buck}(k)$ [V] from each sensor and the setting value $V_{ca}(k)$ [V], according to the following expression (11).

$$\gamma_c = V_{ca\text{-}buck} \div V_{ca} \qquad (11)$$

Upon the laser oscillation, the computing unit 4 still further computes an average value $\gamma_{ave}(m)$ [%] of the output ratios $\gamma(m)$ [%] of the sensors disposed in the multiple output detection units 41, 42, and 43, a maximum value $\gamma_{max}(m)$ [%] of the sensor output of that sensor, and a minimum value $\gamma_{min}(m)$ [%] of the sensor output of that sensor.

Upon the laser oscillation, the computing unit 4 further computes an output ratio $\gamma_c(k)$ [%] of the multiple sensors disposed in the output detection unit 40, an average value $\gamma_{c\text{-}ave}$ [%] of the sensor outputs of those multiple sensors, a maximum value $\gamma_{c\text{-}max}$ [%] of the sensor outputs of those multiple sensors, and a minimum value $\gamma_{c\text{-}min}$ [%] of the sensor outputs of those multiple sensors.

Upon the laser oscillation, the computing unit 4 still further computes an output ratio dispersion $\sigma$ [%] among the sensors disposed in the multiple output detection units 41, 42, and 43 according to the next expression (12).

$$\sigma = (\gamma_{max} - \gamma_{min}) \div \gamma_{ave} \qquad (12)$$

Upon the laser oscillation, the computing unit 4 moreover computes an output ratio dispersion $\sigma_c$ [%] among the multiple sensors disposed in the output detection unit 40 according to the following expression (13).

$$\theta_c = (\gamma_{c\text{-}max} - \gamma_{c\text{-}min}) \div \gamma_{c\text{-}ave} \qquad (13)$$

In addition, the computing unit 4 registers, as $q(n)$, a wavelength covered by a sensor having an output ratio $\gamma$ and an output ratio $\gamma_c$ of 100±2% or less, in the memory unit 6. The computing unit 4 also registers a sensor that detects only the wavelength of $q(n)$ in the memory unit 6 as $r(k)$.

At step S24, the computing unit 4 determines whether or not an output of each of the modules varies uniformly. By way of example, if the output ratio dispersions $\sigma$ and the output ratio dispersion $\sigma_c$ all fall within ±5% inclusive, the computing unit 4 determines that the output of each of the modules varies with uniformity (Yes at S24). That is, the computing unit 4 recognizes that changes in outputs of the modules do not have a difference depending on wavelength, and thus performs the process of step S25.

Otherwise, if any one of the output ratio dispersions $\sigma$ and the output ratio dispersion $\sigma_c$ of the sensors exceeds ±5%, the computing unit 4 determines that the output of at least one module of the outputs of the all modules varies (No at S24). That is, the computing unit 4 determines that changes in outputs of the modules have a difference depending on wavelength, and thus performs the process of step S27.

At step S25, the computing unit 4 computes an output correction factor $\eta_{c\text{-}ave}$ according to the next expression (14).

$$\eta_{c\text{-}ave} = 1 \div \gamma_{c\text{-}ave} \qquad (14)$$

At step S26, the computing unit 4 computes a corrected target output voltage $V_a(m, k)'$ [V] of each sensor according to the next expression (15).

$$V_a(m,k)' = V_a(m,k) \times \eta_{c\text{-}ave} \qquad (15)$$

At step S27, the computing unit 4 sets m=1, and then determines whether or not the output ratio $\gamma(m)$ of each module falls within ±5% inclusive.

If the output ratio $\gamma(m)$ of each module falls within ±5% inclusive (Yes at S27), the computing unit 4 performs the process of step S38.

If the output ratio $\gamma(m)$ of each module exceeds ±5% (No at S27), the computing unit 4 performs the process of step S28.

At step S28, the computing unit 4 determines whether or not an output of each of the laser beams of $\lambda_1$ to $\lambda_4$ vary uniformly. By way of example, if the output ratio dispersion $\sigma_c$ falls within ±5% inclusive for the all (Yes at S28), the outputs of the laser beams of $\lambda_1$ to $\lambda_4$ vary uniformly, and accordingly, the computing unit 4 recognizes that changes in laser outputs do not have a difference depending on wavelength, and thus performs the process of step S38.

Otherwise, if the output ratio dispersion $\sigma_c$ exceeds ±5% (No at S28), the computing unit 4 determines that a change in output of at least one laser beam of all the laser beams of $\lambda_1$ to $\lambda_4$ appears, and that changes in laser outputs have a difference depending on wavelength, and thus performs the process of step S29.

At step S29, the computing unit 4 sets k=1, and then determines whether a set of sensors g(m, k, n) or a sensor r(k) that detects only the wavelength of q(n) is registered in the memory unit 6.

If a set of sensors g or a sensor r(k) that detects only the wavelength of q(n) is registered in the memory unit 6 (Yes at S29), the computing unit 4 performs the process of step S30.

If a set of sensors g or a sensor r(k) that detects only the wavelength of q(n) is not registered in the memory unit 6 (No at S29), the computing unit 4 performs the process of step S39.

At step S30, the computing unit 4 compares the output ratios γ [%] of the registered multiple sensors g, and determines whether or not the difference therebetween falls within ±10% inclusive.

If the difference between the output ratios γ of the multiple sensors g falls within ±10% inclusive (Yes at S30), the computing unit 4 performs the process of step S39.

If the difference between the output ratios γ of the multiple sensors g otherwise exceeds ±10% (No at S30), the computing unit 4 performs the process of step S31.

At step S31, the computing unit 4 registers, in the memory unit 6, the wavelength(s) other than q(n) registered in the memory unit 6 as a wavelength h(m, k, n) at which the laser output has varied. After the registration of the wavelength h(m, k, n), the computing unit 4 performs the process of step S32.

At step S32, the computing unit 4 estimates a feedback voltage at each wavelength with respect to the feedback value of each sensor. Specifically, at step S32, the computing unit 4 computes a feedback value $V_{buck1}(m, k, n)$ [V] for the wavelength q(n) other than the wavelength h(m, k, n) according to the next expression (16).

$$V_{buck1}=V(m,k,n) \qquad (16)$$

In addition, if there is one wavelength h(m, k, n) for each sensor at step S32, the computing unit 4 computes a feedback value $V_{buck2}(m, k, n)$ [V] for the wavelength h(m, k, n) according to the next expression (17).

$$V_{buck2}=V_a(m,k)-V_{buck1}(m,k,n) \qquad (17)$$

Alternatively, if there is more than one wavelength h(m, k, n) for each sensor at step S32, the computing unit 4 computes $V_{buck3}(m, k, n)$ [V] according to the following expression (18), where $V_{a-buck1}(m, k, n)$ represents a value obtained by estimating the output voltage at each wavelength with respect to the feedback value of each sensor in each module; and $β_h(m, k, n)$ represents an output rate for each wavelength about change in each sensor.

$$V_{buck3}=V_{a-buck1}(m,k,n) \times β_h(m,k,n) \qquad (18)$$

At step S33, if "k" is less than "km" (Yes at S33), the computing unit 4 adds 1 to "k" at step S34, and then repeats the processes of step S29 to step S33. If "k" is equal to "km" (No at S33), the computing unit 4 performs the process of step S35.

At step S35, the computing unit 4 computes an output correction factor $η_{ave}(m)$ for the sensor output for each wavelength according to the next expression (19).

$$η_{ave}=W_a(m) \div W_{a-buck}(m) \qquad (19)$$

The estimated total output $W_{a-buck}(m)$ [kW] in the above expression (19) is the estimated output of the laser beam 10, and is computed by $W_{a-buck}=Σ(W_{buck-ave}(k, n))$, where k is an integer equal to 1 or greater, and $W_{buck-ave}$ is the average value of estimated sensor outputs $W_{buck}(m, k, n)$ [kW] at the wavelengths. $W_{buck}$ is computed by $W_{buck}=V_{buck} \times α$, where $V_{buck}(k, n)$ [V] is a value obtained by estimating the output voltage at each wavelength with respect to the feedback value of each sensor.

After the process of step S35, if "m" is less than "mm" at step S36 (Yes at S36), the computing unit 4 adds 1 to "m" at step S37, and then repeats the processes of step S27 to step S36. If "m" is equal to "mm" (No at S36), the computing unit 4 performs the process of step S26.

After the process of step S36, the computing unit 4 computes, at step S26, the corrected target output voltage $V_a(k)'$ [V] of each sensor, using the output correction factor $η_{ave}$ for the sensor output computed at step S35.

At step S38, the computing unit 4 computes an output correction factor $η_{c-ave}(m)$ according to the following expression (20). After computing the output correction factor $η_{c-ave}(m)$ at step S38, the computing unit 4 performs the process of step S36.

$$η_{c-ave}=1 \div_{ave}(m) \qquad (20)$$

At step S39, the computing unit 4 multiplies the feedback value $V_{a-buck}(m, k, n)$ of each sensor by the output rate $β_0(m, k, n)$ for each wavelength of each sensor as shown in the following expression (21), to thereby estimate the feedback voltage $V_{buck}(m, k, n)$ [V] at each wavelength. After the estimation of the feedback voltage $V_{buck}(m, k, n)$ [V], the computing unit 4 performs the process of step S33.

$$V_{buck}=V_{a-buck} \times β_0 \qquad (21)$$

The control unit 5 illustrated in FIG. 6 controls each of the operation power supplies so that the output value of the single combined laser beam 10 matches a target value using the target output voltage $V_a(k)'$ [V] computed at step S26.

The laser oscillation device 100D determines whether or not the laser outputs of the modules and the post-combination laser beam output vary with uniformity, and accordingly sets the output correction factor for the sensor output. In addition, the laser oscillation device 100D not only can manage the sum of the laser outputs from the modules, but also can manage and control the output of each module. By way of example, in a case where the laser resonance module 20 and the laser resonance module 21 each generate a laser beam having the same wavelength, the output detection unit 40 cannot determine which module has emitted a laser beam in question, of the multiple laser resonance modules 20, 21, and 22. Even in such a case, the laser oscillation device 100D can manage and control the output of each module by using the multiple output detection units 41, 42, and 43.

Figure 8:
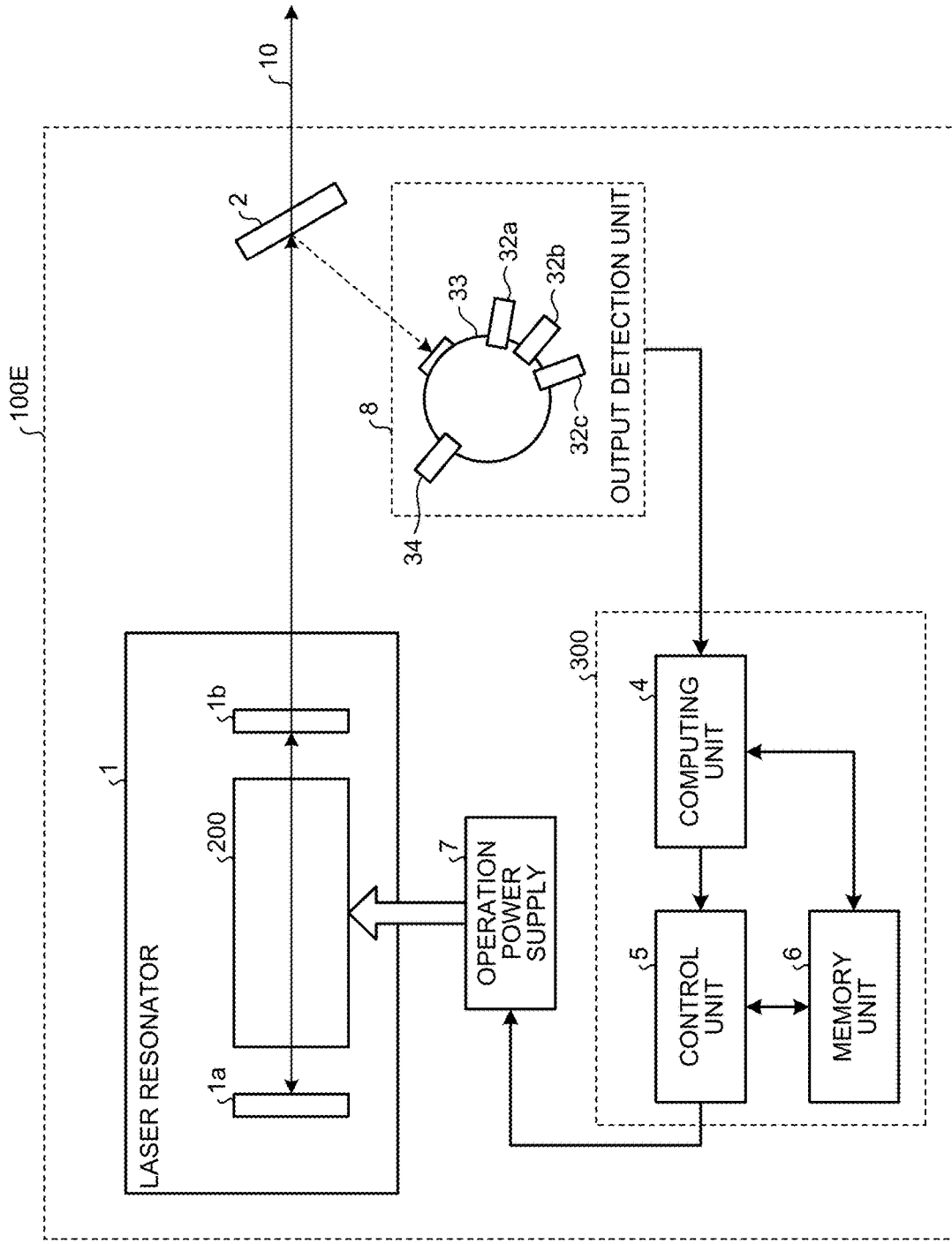
FIG. 8 is a configuration diagram of a laser oscillation device according to a fourth variation of the embodiment of the present invention.

FIG. 8 is a configuration diagram of a laser oscillation device according to a fourth variation of the embodiment of the present invention. A laser oscillation device 100E illustrated in FIG. 8 includes an output detection unit 8 in place of the output detection unit 3.

The output detection unit 8 includes the integrating sphere 33, the multiple sensors 32a, 32b, and 32c, and a thermal sensor 34.

The thermal sensor 34 is a sensor configured to detect the intensity of a laser output based on a temperature change, and is used for scheduled calibration of a sensor output because of lower variation in sensor output than variations in the multiple sensors 32a, 32b, and 32c.

Figure 9:
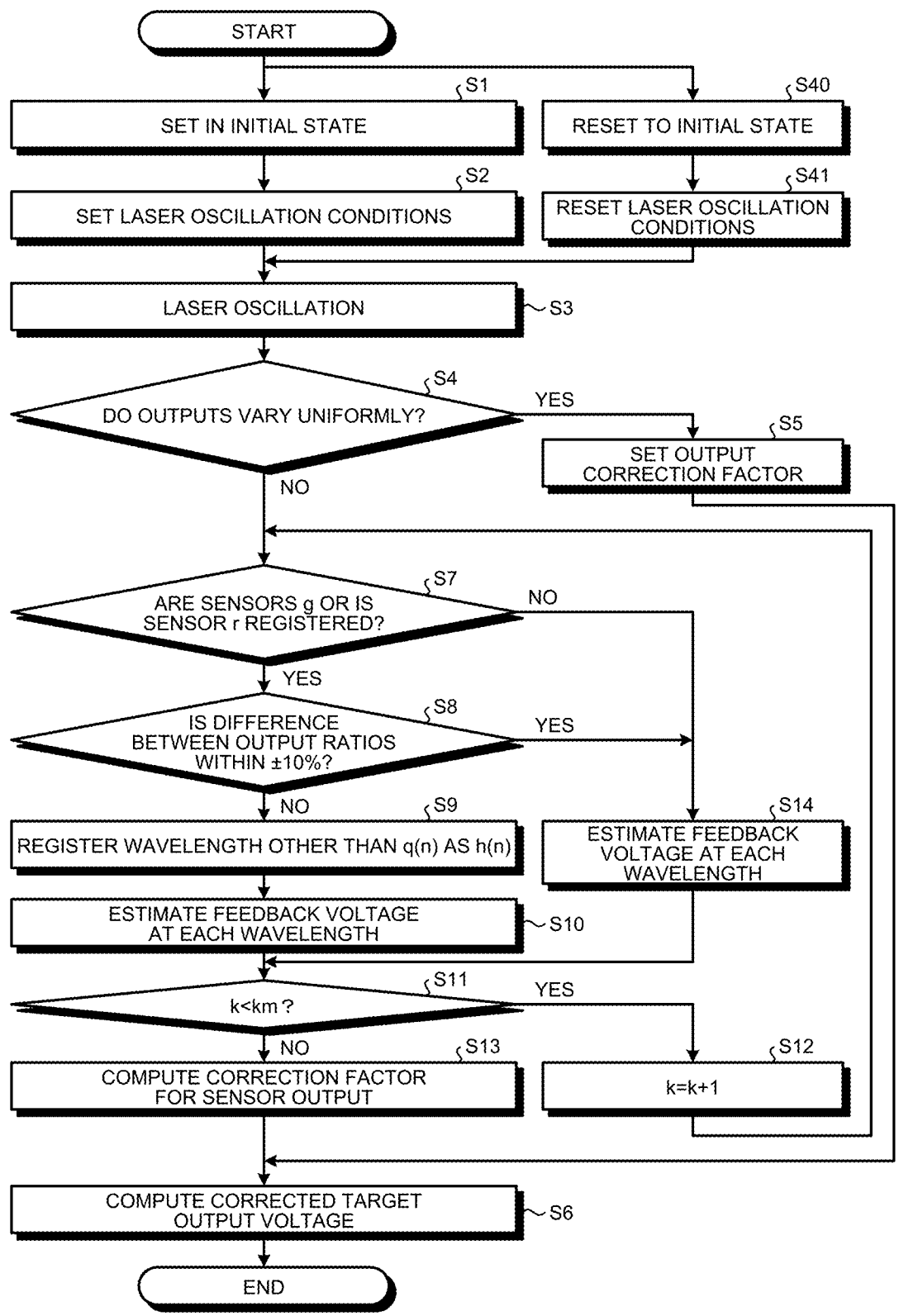
FIG. 9 is a flowchart for describing an operation of the laser oscillation device illustrated in FIG. 8.

FIG. 9 is a flowchart for describing an operation of the laser oscillation device illustrated in FIG. 8. The processes of step S1 to step S14 are similar to those in the flowchart illustrated in FIG. 3. The flowchart illustrated in FIG. 9 is supplemented with steps S40 and S41.

At step S40, in order to perform scheduled output calibration, the computing unit 4 resets the laser oscillation device 100E in an initial state using a sensor output of the thermal sensor 34.

(1) Total value $W_{a0\text{-}ck}$ [W] of the outputs of the multiple laser beams of $\lambda_1$ to $\lambda_4$ (2) Total value $V_{a0\text{-}ck}(k)$ [V] of the sensor outputs of the sensors (3) Simplified correction factor s ($s=(V_{a0\text{-}ck}/W_{a0\text{-}ck})/(V_{a0}/W_{a0})$)

Also at step S40, the computing unit 4 determines the necessity for correction using a simplified correction factor s and a setting value x that has been set in advance. More specifically, with relying on correlation between the sensor output of the thermal sensor 34 and the laser output, the computing unit 4 compares the sensor output of the thermal sensor 34 and the outputs of the multiple sensors 32a, 32b, and 32c that have a higher response speed. In a case where a result of the comparison indicates that the simplified correction factor s changes by an amount within ±Δs inclusive, the computing unit 4 determines that this change falls within a setting tolerance range, and registers a flag indicating no need for correction in the memory unit 6. In a case where the simplified correction factor s satisfies 1−x≤s≤1+x, the computing unit 4 determines that this change falls within a setting tolerance range, and registers a flag indicating a need for correction in the memory unit 6. In a case where the simplified correction factor s satisfies s<1−x or 1+x>s, the computing unit 4 determines that this change is out of the setting tolerance range, indicating possibility of abnormality in the multiple sensors 32a, 32b, and 32c, and thus outputs information for notifying the abnormality.

At step S41, similarly to step S2, what are set again are laser oscillation conditions including the laser output $W_a$ [W], the target output voltage $V_a(k)$ [V] of each sensor, the target output voltage V(k, n) [V] of each sensor for each wavelength, and so on.

The laser oscillation device 100E illustrated in FIG. 8 compares the outputs of the multiple sensors 32a, 32b, and 32c that respond fast and the sensor output of the thermal sensor 34, thereby making it possible to check the level of decrease in the detection sensitivity of each of the multiple sensors 32a, 32b, and 32c. Accordingly, the multiple sensors 32a, 32b, and 32c can be diagnosed with respect to how the sensors are degraded with age, whether some abnormal state is caused in the sensors, and others.

Figure 10:
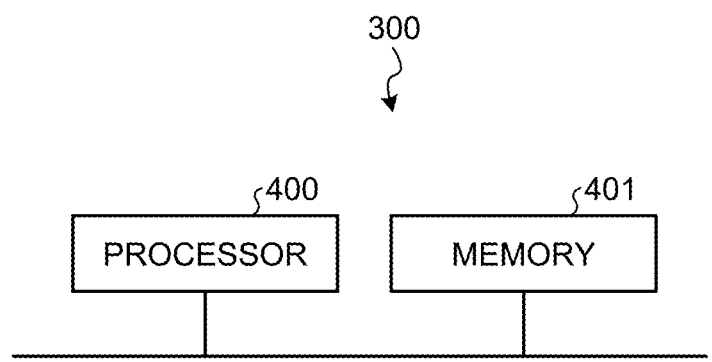
FIG. 10 is a diagram illustrating an example of a hardware configuration implementing the laser output control unit of the embodiment of the present invention.

A hardware configuration of the laser output control unit included in the laser oscillation device according to the embodiment will now be described. FIG. 10 is a diagram illustrating an example of hardware configuration for implementing the laser output control unit of the embodiment of the present invention.

The laser output control unit 300 is implemented by a processor 400 and a memory 401.

The processor 400 is a CPU (also referred to as central processing unit, central processing device, processing device, computing unit, microprocessor, microcomputer, processor, or digital signal processor (DSP)), or a system LSI (large scale integration). The memory 401 corresponds to a semiconductor memory such as a random access memory (RAM), a read-only memory (ROM), a flash memory, an erasable programmable read-only memory (EPROM), or an electrically erasable programmable read-only memory (EEPROM) (registered trademark). The semiconductor memory may be a non-volatile memory or may be a volatile memory. The memory 401 may be, not only a semiconductor memory, but also a magnetic disk, a flexible disk, an optical disk, a compact disc, a MiniDisc, or a digital versatile disc (DVD).

The functionality of the laser output control unit 300 is implemented by storage of a program for performing the processes illustrated in FIGS. 3, 7, and 9 in the memory 401, and by the processor 400 reading and executing the program stored in the memory 401.

In addition, the laser oscillation device according to the present embodiment has the integrating sphere 33 provided with the multiple sensors 32a, 32b, and 32c. This configuration causes the laser beam incident on the integrating sphere 33 to diffuse in the integrating sphere 33, and then irradiate the light-receiving surface of each of the multiple sensors 32a, 32b, and 32c with the resultant light, thereby allowing the intensities of the laser beams incident on the multiple sensors 32a, 32b, and 32c to be uniformized. This allows the first voltages outputted from the multiple sensors 32a, 32b, and 32c to be accurately reflected by the sensitivity characteristics of the multiple sensors 32a, 32b, and 32c, respectively.

Moreover, the laser oscillation device according to the present embodiment has the thermal sensor 34 configured to detect the intensity of a laser output on the basis of a temperature change. This improves robustness against variation of the first voltages outputted from the multiple sensors 32a, 32b, and 32c as compared to the robustness in the case of no use of the thermal sensor 34, and also enables scheduled calibration of sensor outputs.

The configurations described in the foregoing embodiment are merely examples of contents of the present invention, and so may be combined with other publicly known techniques and partially omitted and/or modified without departing from the scope of the present invention.

REFERENCE SIGNS LIST 1, 1A, 1B, 1C laser resonator; 1a total reflection mirror; 1b second partial reflection mirror; 2 first partial reflection mirror; 3, 8, 40, 41, 42, 43, 60 output detection unit; 4 computing unit; 5 control unit; 6 memory unit; 7, 30, 31, 32 operation power supply; 10 laser beam; 20, 21, 22 laser resonance module; 32a, 32b, 32c sensor; 33 integrating sphere; 34 thermal sensor; 50 third partial reflection mirror; 70 diffraction grating; 81, 82, 83 fourth partial reflection mirror; 100, 100A, 100B, 100C, 100D, 100E laser oscillation device; 200 excitation unit; LD1, LD2, LD3 laser diode.

The invention claimed is:

1. A laser oscillation device comprising:
a laser oscillation unit to generate a plurality of first laser beams having their respective wavelengths different from one another;
a plurality of sensors having their respective sensitivity characteristics different from one another, the sensitivity characteristics each representing light-receiving sensitivity for the wavelengths of the first laser beams, the sensors outputting a first voltage for each wavelength dependent on outputs of the first laser beams; and a computing circuit to compute an output ratio between a target output voltage of each of the sensors that has been set based on a machining requirement and the first voltage, and in a case where an output ratio dispersion among the sensors is greater than a setting value, compute an output correction factor for each of the sensors based on an estimated value of an output voltage of each of the sensors calculated for each of the wavelengths of the first laser beams, and to control an output of the laser oscillation unit based on a plurality of second voltages determined by a target output voltage for each wavelength after correction, which has been computed based on the output correction factor.

2. The laser oscillation device according to claim 1, wherein the computing circuit controls the laser oscillation unit so that an output value of a second laser beam obtained by combining together the first laser beams matches a target value, using a total value of the second voltages.

3. The laser oscillation device according to claim 1, comprising: an integrating sphere provided with the sensors.

4. The laser oscillation device according to claim 1, comprising: a thermal sensor.

5. The laser oscillation device according to claim 1, comprising:
an integrating sphere including the sensors; and
a thermal sensor disposed in the integrating sphere, wherein
the computing circuit obtains the sensitivity characteristics of the sensors using a voltage detected by the thermal sensor.

6. The laser oscillation device according to claim 1, wherein, in a case where the output ratio dispersion among the sensors is less than or equal to the setting value, the computing circuit computes an output correction factor based on an average value of output ratios of the sensors, and controls an output of the laser oscillation unit based on the second voltages determined by a target output voltage after the correction, which has been computed based on the output correction factor.

7. The laser oscillation device according to claim 1, wherein a difference between a shortest wavelength and a longest wavelength of the wavelengths is longer than a band of any of the sensitivity characteristics.

* * * * *